(12) United States Patent
Miwa et al.

(10) Patent No.: US 9,967,979 B2
(45) Date of Patent: May 8, 2018

(54) LIGHT-EMITTING DEVICE

(71) Applicant: TOYODA GOSEI CO., LTD., Kiyosu-shi (JP)

(72) Inventors: Tomohiro Miwa, Kiyosu (JP); Hideaki Kato, Kiyosu (JP); Daisuke Kato, Kiyosu (JP); Shota Shimonishi, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 16 days.

(21) Appl. No.: 15/354,825

(22) Filed: Nov. 17, 2016

(65) Prior Publication Data

US 2017/0150609 A1 May 25, 2017

(30) Foreign Application Priority Data

Nov. 24, 2015 (JP) .................................. 2015-228795
Feb. 25, 2016 (JP) .................................. 2016-034877

(51) Int. Cl.
*H05K 1/18* (2006.01)

(52) U.S. Cl.
CPC ... *H05K 1/181* (2013.01); *H05K 2201/10106* (2013.01)

(58) Field of Classification Search
CPC .................... H05K 1/181; H05K 2201/10106
IPC .................................................. H05K 1/181
See application file for complete search history.

(56) References Cited

U.S. PATENT DOCUMENTS

| 8,238,112 B2 | 8/2012 | Kim et al. |
| 9,119,304 B2 | 8/2015 | Kim et al. |
| 2009/0316409 A1 | 12/2009 | Kim et al. |
| 2010/0320483 A1* | 12/2010 | Kadotani ............. F21K 9/00 257/88 |
| 2013/0001606 A1 | 1/2013 | Kim et al. |
| 2015/0176820 A1* | 6/2015 | Abe ..................... F21V 9/08 362/235 |

FOREIGN PATENT DOCUMENTS

| JP | 2010-010682 A | 1/2010 |
| JP | 2012-164783 A | 8/2012 |

* cited by examiner

*Primary Examiner* — Robert May
(74) *Attorney, Agent, or Firm* — McGinn IP Law Group, PLLC

(57) ABSTRACT

A light-emitting device includes a plurality of light-emitting elements mounted on a wiring board, and a plurality of wirings that are provided on the wiring board and each connect predetermined ones of the plurality of light-emitting elements in series. A central element-connection wiring has a longest wiring length among the plurality of wirings, and a voltage applied to a central element is a lowest one of voltages applied to the plurality of light-emitting elements. A closest one of the plurality of light-emitting elements to a center of an element mounting region of the wiring board is defined as the central element, and a wiring that connects in series the central element is defined as the central element-connection wiring.

5 Claims, 8 Drawing Sheets

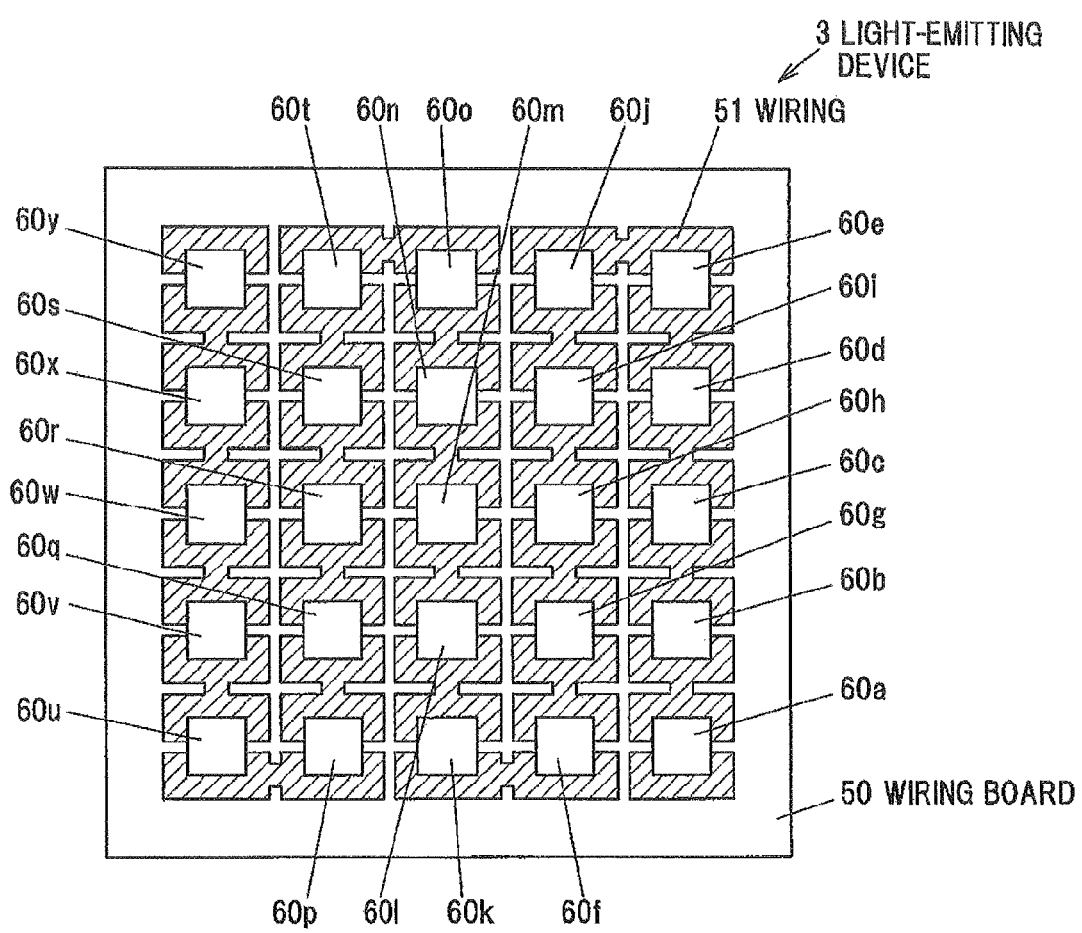

LIGHT-EMITTING DEVICE

The present application is based on Japanese patent application Nos. 2015-228795 and 2016-034877 and filed on Nov. 24, 2015 and Feb. 25, 2016, respectively, the entire contents of which are incorporated herein by reference.

BACKGROUND OF THE INVENTION

1. Field of the Invention

The invention relates to a light-emitting device.

2. Description of the Related Art

A light-emitting device is known in which plural light-emitting elements are mounted on a wiring board in such a manner that all light-emitting elements are connected in series (see, e.g., JP-A-2012-164783).

Also, another light-emitting device is known in which plural light-emitting elements are mounted on a wiring board so as to form plural groups of series-connected light-emitting elements, i.e., plural wirings respectively connecting light-emitting elements in series are provided (see, e.g., JP-A-2010-10682).

SUMMARY OF THE INVENTION

In the light-emitting devices with plural light-emitting elements mounted on the board, heat generated by the light-emitting elements is generally likely to be concentrated and confined in the center portion of an element mounting region and may cause a decrease in lifetime or light emission characteristics of the device.

In the light-emitting device described in JP-A-2012-164783, all light-emitting elements are connected in series such that the same voltage is applied to all light-emitting elements. Thus, all light-emitting elements generate the same amount of heat and the heat is confined in the center portion of the element mounting region.

Also, in the light-emitting device described in JP-A-2010-10682, two wirings each of which connects light-emitting elements in series have different wiring lengths and half of the light-emitting elements closest to the center of the element mounting region are connected to the shorter wiring. Since wiring resistance is different depending on length of the wiring, light-emitting elements connected to the shorter wiring are supplied with high voltage and generate a large amount of heat. In other words, the light-emitting device described in JP-A-2010-10682 has high-heat-generating light-emitting elements at the positions closest to the center of the element mounting region. Thus, heat is likely to be confined in the center portion of the element mounting region.

It is an object of the invention to provide a light-emitting device that prevents the heat confinement in the center portion of the element mounting region even if plural light-emitting elements are mounted on the wiring board.

(1) According to an embodiment of the invention, a light-emitting device comprises:

a plurality of light-emitting elements mounted on a wiring board; and a plurality of wirings that are provided on the wiring board and each connect predetermined ones of the plurality of light-emitting elements in series, wherein a central element-connection wiring has a longest wiring length among the plurality of wirings, and a voltage applied to a central element is a lowest one of voltages applied to the plurality of light-emitting elements, and wherein a closest one of the plurality of light-emitting elements to a center of an element mounting region of the wiring board is defined as the central element, and a wiring that connects in series the central element is defined as the central element-connection wiring.

In the above embodiment (1) of the invention, the following modifications and changes can be made.

(i) The central element-connection wiring comprises a narrow portion that has a smaller width than other ones of the plurality of wirings.

(ii) The light-emitting device comprises a COB light-emitting device.

(iii) The plurality of light-emitting elements comprise a light-emitting element whose mounting direction is 90 or 180 degrees rotated as compared to other ones of the plurality of light-emitting elements.

EFFECTS OF THE INVENTION

According to an embodiment of the invention, a light-emitting device can be provided that prevents the heat confinement in the center portion of the element mounting region even if plural light-emitting elements are mounted on the wiring board.

BRIEF DESCRIPTION OF THE DRAWINGS

Next, the present invention will be explained in more detail in conjunction with appended drawings, wherein:

FIG. 5 is a plan view showing a light-emitting device as Comparative Example having a circuit configuration in which the number of series connections is equal to the number of parallel connections;

DETAILED DESCRIPTION OF THE PREFERRED EMBODIMENTS

Embodiment

Configuration of Light-Emitting Device

Figure 1A:
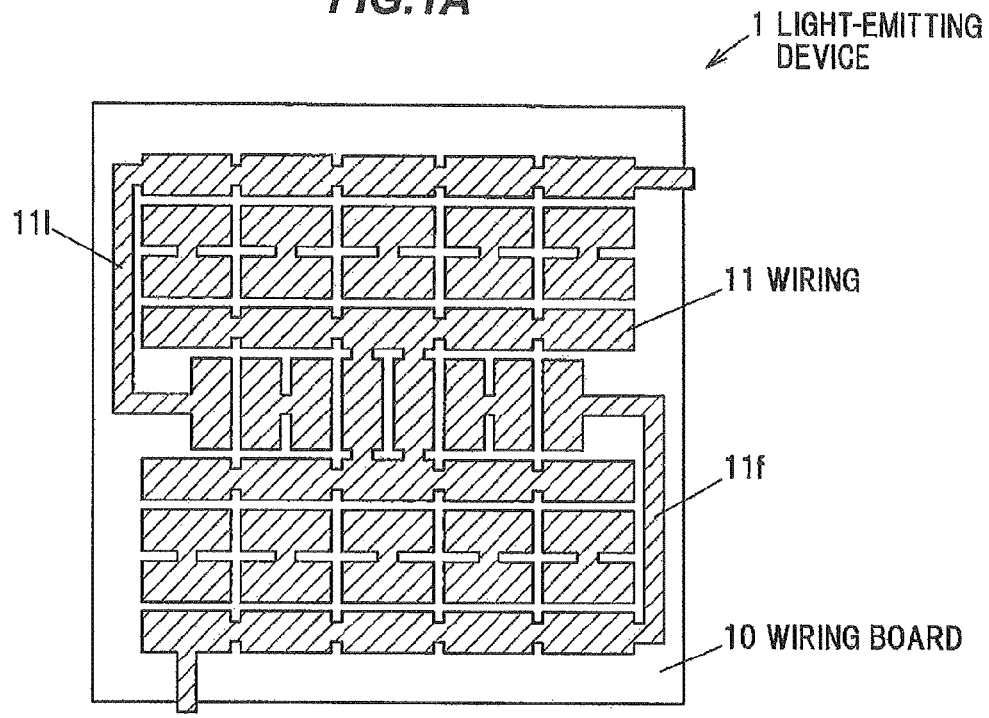
FIGS. 1A and 1B are plan views showing a light-emitting device in an embodiment.
Figure 1B:
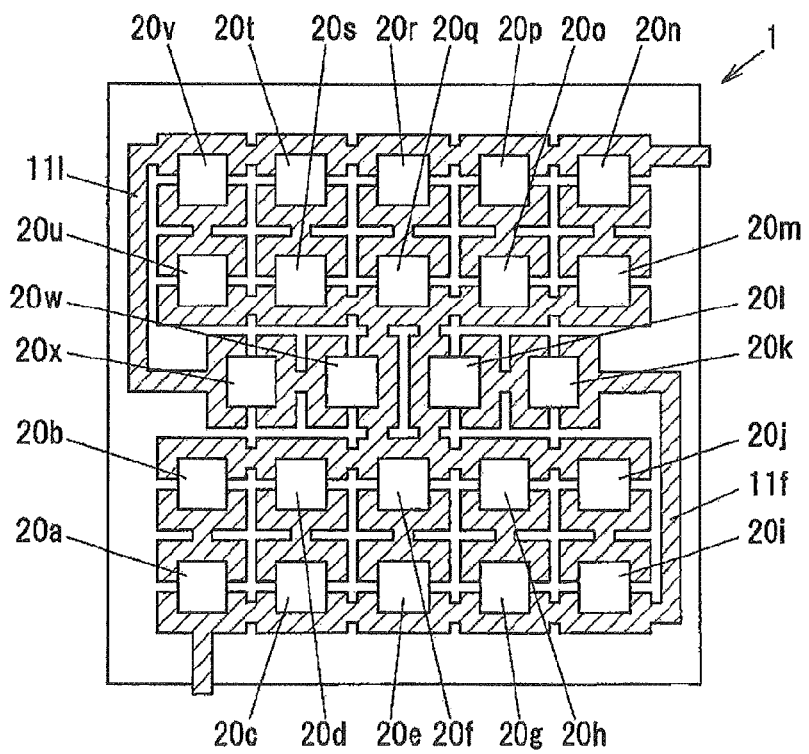

FIGS. 1A and 1B are plan views showing a light-emitting device 1 in an embodiment.

The light-emitting device 1 has a wiring board 10 and plural light-emitting elements 20 (20a to 20x) mounted on the wiring board 10. FIG. 1A shows the state before mounting the light-emitting elements 20 and FIG. 1B shows the state after mounting the light-emitting elements 20.

The plural light-emitting elements 20 are arranged so that plural groups of series-connected light-emitting elements are formed. The wiring board 10 thus has plural wirings 11 (11a to 11l) respectively connecting the light-emitting elements in series.

Figure 2:
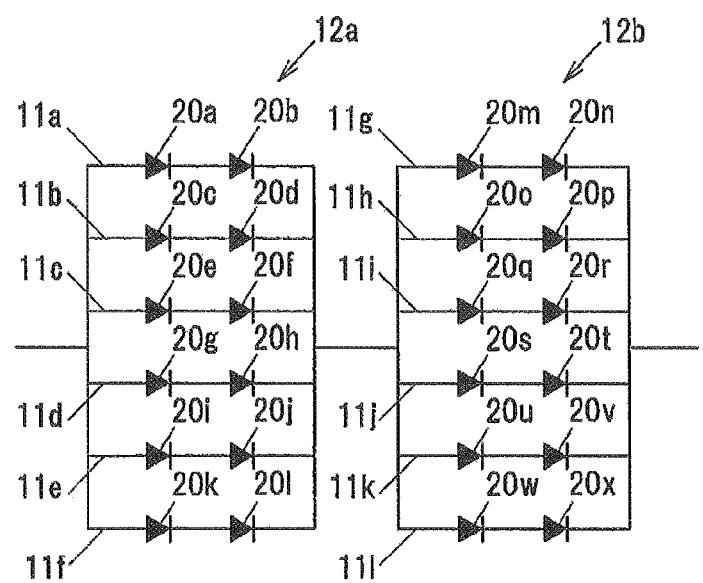
FIG. 2 is a circuit diagram illustrating the light-emitting device in the embodiment.

FIG. 2 is a circuit diagram illustrating the light-emitting device 1 in the embodiment. As shown in FIG. 2, the light-emitting device 1 has two parallel circuits 12a and 12b which are connected in series, and each of the parallel circuits 12a and 12b has six parallel-connected wirings 11 each of which connects two light-emitting elements 20 in series.

As shown in FIGS. 1A, 1B and 2, the wiring 11f connecting the light-emitting element 20k to the light-emitting element 20l in series and the wiring 11l connecting the light-emitting element 20w to the light-emitting element 20x in series have the longest wiring length among the wirings 11a to 11l (among all wirings 11). Therefore, voltage applied to the light-emitting elements 20k, 20l, 20w and 20x is the lowest among the light-emitting elements 20a to 20x.

In addition, as shown in FIG. 1B, the light-emitting elements 20l and 20w are also the closest, among the light-emitting elements 20a to 20x, to the center of an element mounting region of the wiring board 10, i.e., the light-emitting elements 20l and 20w are arranged at the positions at which heat is most likely to be confined. The element mounting region here is a region for mounting elements and is a square region formed of straight lines connecting the mounting positions of the light-emitting elements 20a, 20i, 20n and 20v in the example shown in FIGS. 1A and 1B.

Hereinafter, elements located closest to the center of the element mounting region are sometimes called central elements. As described above, the light-emitting elements 20l and 20w are the central elements of the light-emitting device 1. Meanwhile, wirings connecting in series the central elements are sometimes called central element-connection wirings. The wirings 11f and 11l are the central element-connection wirings of the light-emitting device 1.

That is, in the light-emitting device 1, the central element-connection wirings (the wirings 11f and 11l), which connect in series the central elements (the light-emitting elements 20l and 20w) located closest to the center of the element mounting region at which heat is most likely to be confined, have the longest wiring length and the highest wiring resistance.

Thus, voltage applied to the central elements (the light-emitting elements 20l and 20w) is the lowest among the light-emitting elements 20a to 20x, and the amount of heat generated by the central elements (the light-emitting elements 20l and 20w) is the smallest among the light-emitting elements 20a to 20x. Heat confined in the center of the element mounting region can be thereby effectively reduced in the light-emitting device 1.

The wiring board 10 is, e.g., a ceramic board such as $Al_2O_3$ board or AlN board, a metal board such as Al board or Cu board of which surface is covered with an insulating film, or a glass epoxy board, and has the wirings 11 of copper, etc., on the surface.

The light-emitting element 20 is, e.g., an LED chip or a laser diode chip. The light-emitting element 20 may be either of face-up type or face-down type.

The light-emitting device 1 in the example shown in FIGS. 1A and 1B is a COB (Chip On Board) light-emitting device. Heat confinement is more likely to occur as the number of the light-emitting elements 20 mounted on the light-emitting device 1 increases. Therefore, heat confinement is effectively reduced particularly when the light-emitting device 1 is provided with many light-emitting elements as is in the COB light-emitting device.

Figure 3:
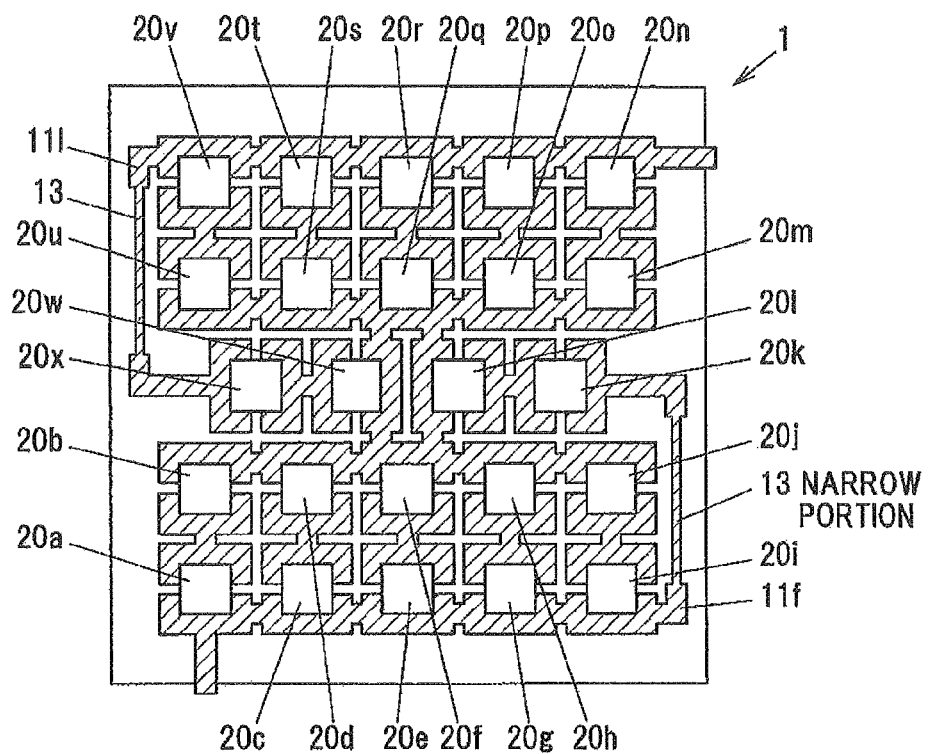
FIG. 3 is a plan view showing a modification of the light-emitting device in the embodiment.

FIG. 3 is a plan view showing a modification of the light-emitting device 1 in the embodiment. In this modification, the wirings 11f and 11l as the central element-connection wirings include narrow portions 13 having a smaller width than the other portions of the wirings 11a to 11l. Obviously, "the other portions of the wirings 11a to 11l" do not include bonding pads.

Since the narrow portions 13 have higher wiring resistance than the other portions, voltage applied to the light-emitting elements 20l and 20w as the central elements is reduced and it is thereby possible to reduce heat confinement in the center of the element mounting region more effectively.

Figure 4A:
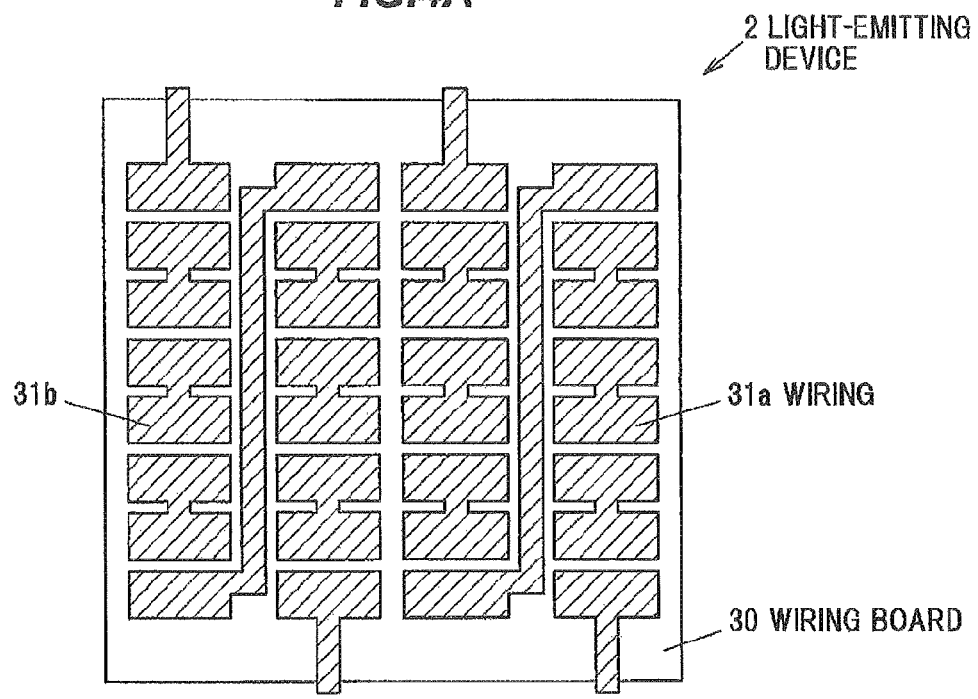
FIGS. 4A and 4B are plan views showing a light-emitting device in Comparative Example.
Figure 4B:
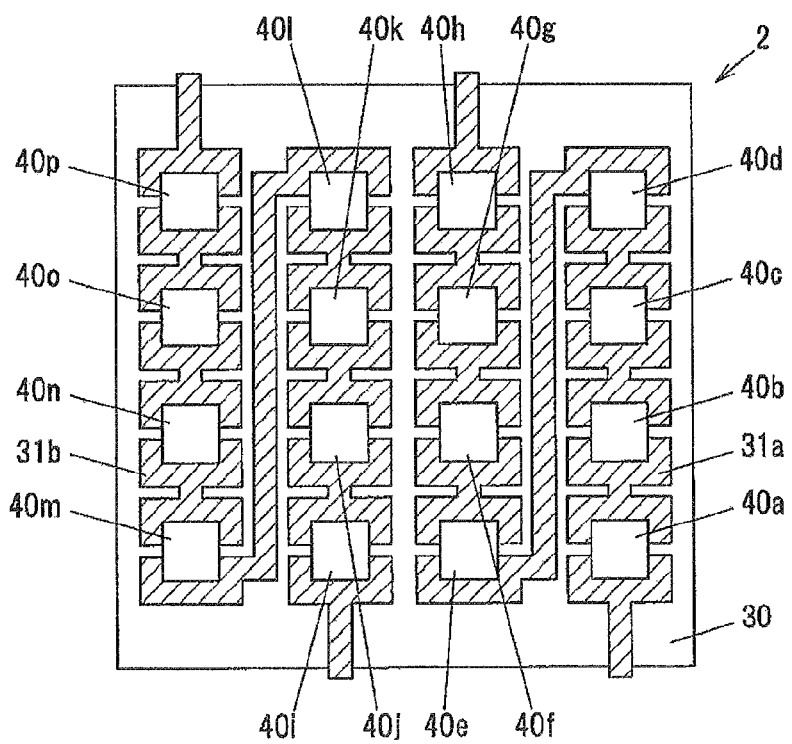

FIGS. 4A and 4B are plan views showing a light-emitting device 2 in Comparative Example.

The light-emitting device 2 has a wiring board 30 and plural light-emitting elements 40 (40a to 40p) mounted on the wiring board 30. FIG. 4A shows the state before mounting the light-emitting elements 40 and FIG. 4B shows the state after mounting the light-emitting elements 40.

In the light-emitting device 2, the light-emitting elements 40a to 40h are connected in series and the light-emitting elements 40i to 40p are connected in series. The length of a wiring 31a connecting the light-emitting elements 40a to 40h in series is the same as the length of a wiring 31b connecting the light-emitting elements 40i to 40p in series.

Thus, the same voltage is applied to the light-emitting elements 40a to 40p. This means that voltage applied to the light-emitting elements 40f, 40g, 40j and 40k as the central elements of the light-emitting device 2 is the same as voltage applied to the other light-emitting elements.

That is, the amount of heat generated by the light-emitting elements 40f, 40g, 40j and 40k as the central elements of the light-emitting device 2 is the same as the amount of heat generated by the other light-emitting elements. Therefore, in the light-emitting device 2, heat is likely to be confined in the center of the element mounting region.

The light-emitting device 1 in the embodiment has a 4-series×6-parallel configuration in which the number of series connections is different from the number of parallel connections, but the circuit pattern of the light-emitting device 1 is close to a square shape. Next, this point will be described using Comparative Example.

Figure 6:
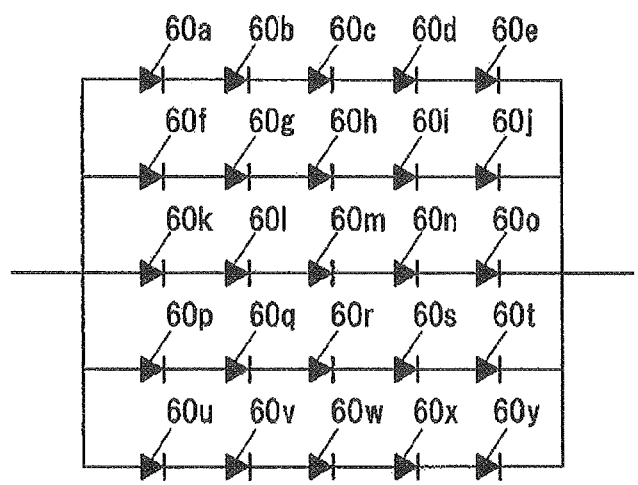
FIG. 6 is a circuit diagram illustrating the light-emitting device shown in FIG. 5.

FIG. 5 is a plan view showing a light-emitting device 3 as Comparative Example having a circuit configuration in which the number of series connections is equal to the number of parallel connections. FIG. 6 is a circuit diagram illustrating the light-emitting device 3.

The light-emitting device 3 has a wiring board 50 and plural light-emitting elements 60 (60a to 60y) mounted on the wiring board 50. The wiring board 50 has a wiring 51 to which the plural light-emitting elements 60 are connected.

The light-emitting device 3 has a 5-series×5-parallel configuration in which a series circuit of the light-emitting elements 60a to 60e, a series circuit of the light-emitting elements 60f to 60j, a series circuit of the light-emitting elements 60k to 60o, a series circuit of the light-emitting elements 60p to 60t and a series circuit of the light-emitting elements 60u to 60y are connected in parallel.

Since the light-emitting device 3 has a circuit configuration in which the number of series connections is equal to the number of parallel connections, the circuit pattern can be designed in a shape close to a square.

On the other hand, the light-emitting device 2 shown in FIGS. 4A and 4B has a 8-series×2-parallel configuration in which the number of series connections is different from the number of parallel connections. Thus, a wiring between the light-emitting elements 40d and 40e and a wiring between the light-emitting elements 40l and 40m are routed around between the light-emitting elements to provide a circuit pattern with a shape close to a square.

As such, wirings generally need to be routed around between light-emitting elements so that a light-emitting device having a circuit configuration with the different numbers of series connections and parallel connections can have a shape close to a square, resulting in that a surface area of the light-emitting device increases.

In contrast, the light-emitting device 1 in the embodiment has a circuit pattern with a shape close to a square while having a 4-series×6-parallel configuration in which the number of series connections is different from the number of parallel connections. This is because the light-emitting elements are not mounted in the same direction and some light-emitting elements are mounted so as to be rotated at 90° relative to other light-emitting elements.

In the light-emitting device 1, the light-emitting elements 20k, 20l, 20w and 20x are rotated at 90° relative to the other light-emitting elements. It is thereby possible to design a circuit pattern in a shape close to a square without routing around the wirings between the light-emitting elements. In addition, this also allows the light-emitting device 1 to be downsized. As such, even when having a circuit configuration in which the number of series connections is different from the number of parallel connections, it is possible to design a circuit pattern in a shape close to a square by mounting some light-emitting elements in a 90- or 180-degree different direction from the other light-emitting elements.

Figure 7:
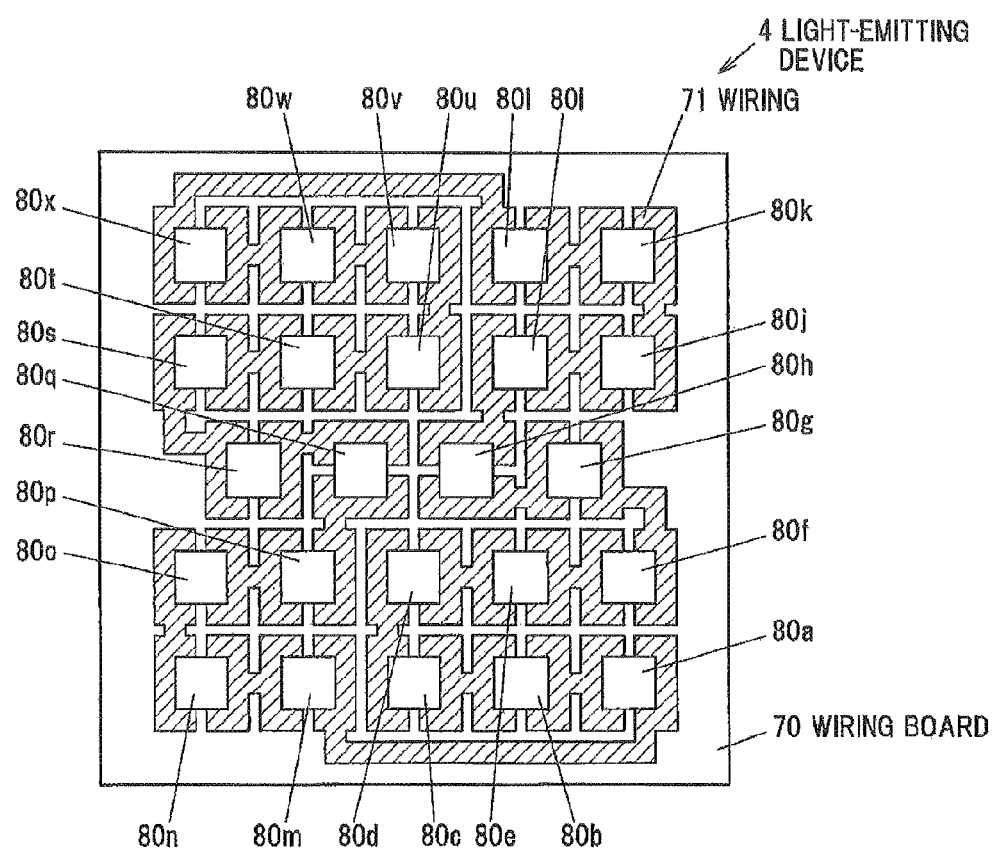
FIG. 7 is a plan view showing a light-emitting device in which some light-emitting elements are mounted in a 90- or 180-degree different direction from other light-emitting elements.
Figure 8:
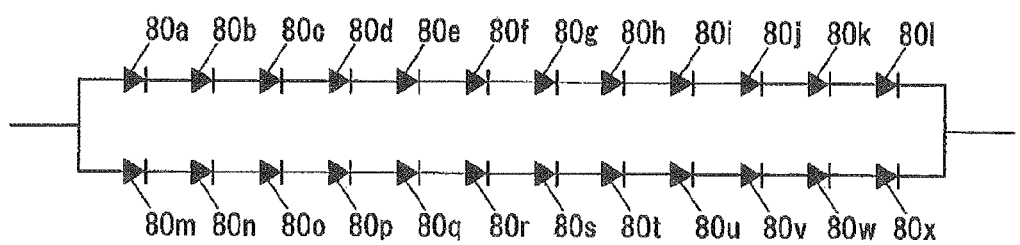
FIG. 8 is a circuit diagram illustrating the light-emitting device shown in FIG. 7.

FIG. 7 is a plan view showing a light-emitting device 4 in which some light-emitting elements are mounted in a 90- or 180-degree different direction from other light-emitting elements. FIG. 8 is a circuit diagram illustrating the light-emitting device 4.

The light-emitting device 4 has a wiring board 70 and plural light-emitting elements 80 (80a to 80x) mounted on the wiring board 70. The wiring board 70 has a wiring 71 to which the plural light-emitting elements 80 are connected.

The light-emitting device 4 has a 12-series×2-parallel configuration in which a series circuit of the light-emitting elements 80a to 80l and a series circuit of the light-emitting elements 80m to 80x are connected in parallel.

In the light-emitting device 4, the light-emitting elements 80h and 80q are mounted so as to be rotated at 90° relative to the other light-emitting elements. Meanwhile, the light-emitting elements 80d to 80f, 80i, 80j, 80o, 80p and 80s to 80u are mounted so as to be rotated at 180° relative to the other light-emitting elements. It is thereby possible to design a circuit pattern in a shape close to a square without routing around the wirings between the light-emitting elements, while having a 12-series×2-parallel configuration in which the number of series connections is different from the number of parallel connections.

Effects of the Embodiment

In the light-emitting device of the embodiment, voltage applied to the light-emitting elements closest to the center of the element mounting region is the lowest to reduce heat generation, and it is thereby possible to reduce heat confinement in the center of the element mounting region. As a result, it is possible to suppress a decrease in lifetime or light emission characteristics of the light-emitting device.

In addition, even when having a circuit configuration in which the number of series connections is different from the number of parallel connections, it is possible to design a circuit pattern in a shape close to a square by mounting some light-emitting elements in a 90- or 180-degree different direction from the other light-emitting elements. In addition, this also allows the light-emitting device to be downsized.

Although the embodiment of the invention has been described, the invention is not intended to be limited to the embodiment and the various kinds of modifications can be implemented without departing from the gist of the invention.

For example, the circuit configuration such as arrangement of wiring pattern or light-emitting elements is not limited to that described in the embodiment.

In addition, the invention according to claims is not to be limited to the above-mentioned embodiment. Further, please note that all combinations of the features described in the embodiment are not necessary to solve the problem of the invention.

What is claimed is:

1. A light-emitting device, comprising:
   a plurality of light-emitting elements mounted on a wiring board; and
   a plurality of wirings that are provided on the wiring board and each connect predetermined ones of the plurality of light-emitting elements in series,
   wherein a central element-connection wiring has a longest wiring length among the plurality of wirings, and a voltage applied to a central element is a lowest one of voltages applied to the plurality of light-emitting elements, and
   wherein a closest one of the plurality of light-emitting elements to a center of an element mounting region of the wiring board is defined as the central element, and a wiring that connects in series the central element is defined as the central element-connection wiring.

2. The light-emitting device according to claim 1, wherein the central element-connection wiring comprises a narrow portion that has a smaller width than other ones of the plurality of wirings.

3. The light-emitting device according to claim 1, wherein the light-emitting device comprises a COB light-emitting device.

4. The light-emitting device according to claim 2, wherein the light-emitting device comprises a COB light-emitting device.

5. The light-emitting device according to claim 1, wherein the plurality of light-emitting elements comprise a light-emitting element whose mounting direction is 90 or 180 degrees rotated as compared to other ones of the plurality of light-emitting elements.

* * * * *